(12) United States Patent
Tao et al.

(10) Patent No.: US 6,916,708 B2
(45) Date of Patent: Jul. 12, 2005

(54) METHOD OF FORMING A FLOATING GATE FOR A STACKED GATE FLASH MEMORY DEVICE

(75) Inventors: Hou Tao, Taipei (TW); Jih Ren Tsai, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/728,216

(22) Filed: Dec. 4, 2003

(65) Prior Publication Data

US 2005/0124115 A1 Jun. 9, 2005

(51) Int. Cl.[7] ............................................. H01L 21/336
(52) U.S. Cl. ...................... 438/257; 438/778; 438/942
(58) Field of Search ................................. 438/201, 211, 438/257, 262, 300, 759, 761, 778, 791, 942

(56) References Cited

U.S. PATENT DOCUMENTS

| 6,165,845 | A | 12/2000 | Hsieh et al. | 438/260 |
|---|---|---|---|---|
| 6,171,906 | B1 | 1/2001 | Hsieh et al. | 438/257 |
| 6,479,859 | B2 | 11/2002 | Hsieh et al. | 257/315 |
| 6,528,844 | B1 | 3/2003 | Hopper et al. | 257/316 |
| 6,537,869 | B1 | 3/2003 | Furuhata | 438/239 |
| 6,573,153 | B2 * | 6/2003 | Maeda | 438/427 |
| 6,656,854 | B2 * | 12/2003 | Miyano et al. | 438/778 |

* cited by examiner

*Primary Examiner*—Phuc T. Dang

(57) ABSTRACT

A new method to form a floating gate for a flash memory device is achieved. The method comprises forming a first conductor layer overlying a substrate with a gate dielectric layer therebetween. A masking layer is deposited overlying the first conductor layer. The masking layer is patterned to expose first regions of and to cover second regions of the first conductor layer. A plurality of first concave surfaces are formed on the first conductor layer first regions. The masking layer is removed. A plurality of second concave surfaces are formed on the first conductor layer second regions. The first conductor layer is patterned to form floating gates. The interfaces between the plurality of first and second concave surfaces form vertical tips on the floating gates. A method to form an electron emitter is also disclosed.

20 Claims, 7 Drawing Sheets

ERASING

PROGRAMMING

READING

METHOD OF FORMING A FLOATING GATE FOR A STACKED GATE FLASH MEMORY DEVICE

BACKGROUND OF THE INVENTION (1) Field of the Invention

The invention relates to a method to manufacture an integrated circuit device, and, more particularly, to a method to roam a floating gate for a stacked gate flash memory in the manufacture of an integrated circuit device.

(2) Description of the Prior Art

Non-volatile memory devices are widely used in the art of electronics. Non-volatile memories provide-stored data to an electronic system in a form that can be retained even during a loss of system power. Non-volatile memory can take the form of one-time programmable devices, such as electrically programmable read-only memory (EPROM), or re-programmable devices, such as electrically erasable, programmable read-only memory (EEPROM). A particular type of EEPROM that is of interest in the present invention is the flash EEPROM. A flash EEPROM provides a means to rapidly erase the EEPROM memory array prior to programming or re-programming.

Referring now to FIG. 1, exemplary flash EEPROM device is shown in cross sectional representation. A flash device is a MOSFET device where a complex gate 14 is used. The complex gate comprises a floating gate 18 and a control gate 22. The floating gate comprises a first conductor layer 18 overlying the substrate 10 with a gate dielectric layer 16 therebetween. The control gate comprises a second conductor layer 22 in close proximity to the floating gate 18 and with a second dielectric layer 20 lying between-the first and second conductor layers 18 and 22. Further, the example device is a stacked gate device. In a stacked gate device, the channel region of the substrate 10—the region of the substrate 10 between the drain region 24 and the source region 26—is controlled indirectly by the control gate 22. In the flash device, the memory transistor is turned ON —such that current can conduct from drain 24 to source 26—when the control gate 22 bias is large enough to invert the entire channel region. As a result, a voltage bias on the control gate 22 is divided across the series capacitance of the floating gate 18 prior to interacting with the channel.

The flash device exhibits two, distinct states: programmed and erased. In the erased state, the floating gate 18 is devoid of excess electron charge. In the programmed state, the floating gate 18 has a large amount of excess electron charge trapped on the first conductor layer 18. The presence of excess electron charge on the floating gate increases the effective threshold voltage (Vth) of the device. That is, a larger gate voltage must be applied to the control gate 22 to turn ON the flash device in the programmed (excess electron) state than in the erased state (no excess electrons) state. In the applied circuit, a current sensing mechanism is used to determine the ON-OFF state of the device in the presence of a standard control voltage and a drain-to-source voltage. The determined ON-OFF state is used to "read" the stored data state of the cell as a "0" or "1". Alternatively, in a multiple-state device, any of several threshold voltages Vth may by stored by trapping various, relative amounts of charge on the floating gate 18.

Erasing, programming, and reading of the flash device are illustrated in FIG. 1. Erasing is accomplished by grounding the control gate 22 and the drain 24, while the source 26 is forced to a large programming voltage ($V_{PP}$). As a result, electrons on the floating gate 18 are attracted toward the source 26. Due to the large erasing voltage ($V_{PP}$), electrons will tunnel through the thin, gate oxide layer 16 and enter the source 26. The floating gate 18 is thereby erased by removal of electrons. Programming is performed by forcing a drain-to-source voltage by grounding the source 26 and forcing the drain 24 to $V_d$. The control gate 22 is forced to a gate voltage $V_d$ that is larger than the drain-to-source voltage $V_d$. During programming, electrons are injected, due to impact ionization, through the thin, gate dielectric layer 16 and into the floating gate 18. The floating gate 18 is thereby programmed by addition of electrons. The stacked gate flash device is read by forcing a reading voltage of, for example, $V_{CC}$, onto the control gate 22 during a drain-to-source voltage of, for example, about 1 Volt. The drain current of the device is monitored to determine if the device is ON or OFF to thereby determine the threshold voltage of the device. It is found in the art that the stacked gate device exhibits relatively poor erasing efficiency. In addition, the stacked gate flash device requires a relatively large programming voltage $V_{pp}$ for erasing. Finally, the stacked gate flash can exhibit incomplete erasing due to the inefficiency of the design.

Referring now to FIG. 2, a split-gate flash device is shown. The split-gate device can achieve rapid programming and erasing times while exhibiting very stable and long enduring data retention. In the split-gate structure, part of the control gate 40 directly overlies the floating gate 34 while another part of the control gate 40 directly overlies the substrate 30 without floating gate 34 intervening. By forming a part of the control gate 40 directly over the channel region of the substrate 30, the split-gate device provides significantly better performance during an over-erase event. In an over-erase event, the floating gate 34 is discharged beyond a neutral condition.

The floating gate 34 is erased by forcing a large, programming voltage $V_{pp}$ of about 14 Volts onto the control gate 40 while the drain 44 and the source 42 are grounded. Electrons are pulled from the floating gate 34 to the control gate 40 to cause the floating gate to become discharged. If the floating gate 34 is overly discharged, then the floating gate 34 will actually contain too little electron charge. This will cause the Vth of the device to fall. If the floating gate 34 is over-erased far enough, then device will become a depletion device where the channel is effectively ON all of the time even in the absence of a positive voltage on the control gate 40. In a stacked gate device, an over-erase condition will cause excessive leakage current that can limit the operating performance of the cell and of the overall array. The split-gate form reduces the over-erase effect because the Vth of the device in the channel region directly underlying the control gate 40 is not affected by the over-erase condition. Therefore, the control gate 40 will hold the channel OFF during the standby state and eliminate the leakage current even if the floating gate is over-erased.

The split-gate device is programmed by forcing a large programming voltage $V_{pp}$ of about 12 Volts on the drain while the control gate 40 is forced to a low programming voltage of about 1.6 Volts. The floating gate 34 is programmed by impact ionization causing electrons to tunnel through the gate oxide 32 and to charge the floating gate. The split-gate device is read by forcing a low voltage of $V_{cc}$ on the control gate 40 while a reading voltage $V_{read}$ of between about 1 Volt and 2 Volts is forced from drain to source. The drain current is monitored to determine the OFF-ON state of the cell based on the threshold voltage.

A second feature of the split-gate device is the use of lateral floating gate tips 35. Floating gate tips 35 cause a concentration of the electric field between the control gate 40 and the floating gate 34 during an erasing operation. As a result, the floating gate 34 can be erased more completely and more quickly than in a comparable split-gate flash device that does not have these tips 35. In this way, the erasing conditions, and especially the control gate voltage, can be made less severe and hazardous to the long-term reliability of the device. The floating gate 34 with erasing tips 35 is formed by a local oxidation of silicon (LOCOS) process performed on the polysilicon layer 34 of the floating gate. The split-gate device offers significant performance advantages over the stacked gate device. However, the split-gate device requires significantly more area per cell than the stacked gate device. Achieving a stacked gate, flash memory device exhibiting improved erasing performance is therefore a desirable outcome of the present invention.

Several prior art inventions relate to flash memory devices and methods of manufacture. U.S. Pat. No. 6,171,906 B1 to Hsieh et al discloses a split-gate flash device and method of manufacture showing a floating gate with an erasing tip formed using LOCOS. U.S. Pat. No. 6,165,845 to Hsieh et al describes a split-gate flash device and method of manufacture. An angled etch is used to create an angled floating gate prior to using LOCOS to form the floating gate tips. U.S. Pat. Nos. 6,479,859 to Hsieh et al, 6,537,896 to Furuhata, and 6,528,844 to Hopper et al also pertain to the art of the present invention.

SUMMARY OF THE INVENTION

A principal object of the present invention is to provide an effective and very manufacturable floating gate for a flash memory device.

A further object of the present invention is to provide a method to form a floating gate having vertical tips to improve erasing performance.

A yet further object of the present invention is to provide a method to form a floating gate that does not compromise programming, erasing, or data retention.

A yet further object of the present invention is to provide a method to form a flash memory device.

A yet further object of the present invention is to provide a method to form a stacked gate, flash memory device capable of improved performance.

Another further object of the present invention is to provide a floating gate with a preferred topology.

Another further object of the present invention is to provide a stacked gate, flash device having a floating gate with a preferred topology.

Another further object of the present invention is to provide an electron emitter device.

Another further object of the present invention is to provide a method to form an electron emitter device.

In accordance with the objects of the present invention, a method to form a floating gate for a flash memory device is achieved. The method comprises forming a first conductor layer overlying a substrate with a gate dielectric layer therebetween. A masking layer is deposited overlying the first conductor layer. The masking layer is patterned to expose first regions of and to cover second regions of the first conductor layer. A plurality of first concave-surfaces are formed on the first conductor layer first regions. The masking layer is removed. A plurality of second concave surfaces are formed on the first conductor layer second regions. The first conductor layer is patterned to form floating gates. The interfaces between the plurality of first and second concave surfaces form vertical tips on the floating gates.

Also in accordance with the objects of the present invention, a flash memory device is achieved. The device comprises, first, a substrate. A floating gate overlies the substrate. The floating gate comprises a gate dielectric layer overlying the substrate and a first conductor layer overlying the gate dielectric layer. The first conductor layer comprises first and second concave surfaces. The interfaces between the first and second concave surfaces form vertical tips on the floating gate. A control gate overlies the floating gate. The control gate comprises a second dielectric layer overlying the floating gate and a second conductor layer overlying the second dielectric layer.

Also in accordance with the objects of the present invention, a method to form an electron emitter is achieved. The method. A plurality of continuous concave surfaces are formed on the conductor layer. The conductor layer is patterned to form a plurality of vertical tips between the plurality of continuous concave surfaces on the electron emitter.

Also in accordance with the objects of the present invention, an electron emitter device is achieved. The device comprises a substrate and an electron emitter. The electron emitter overlies the substrate. The electron emitter comprises a conductor layer with a surface having a plurality of vertical tips between a plurality of concave surfaces.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form a floating gate having vertical tips to improve erasing performance. A method to form a stacked gate, flash EEPROM memory device with an improved floating gate is disclosed. It should be clear to those experienced in the art that the present invention can be applied and extended without deviating from the scope of the present invention.

Figure 1:
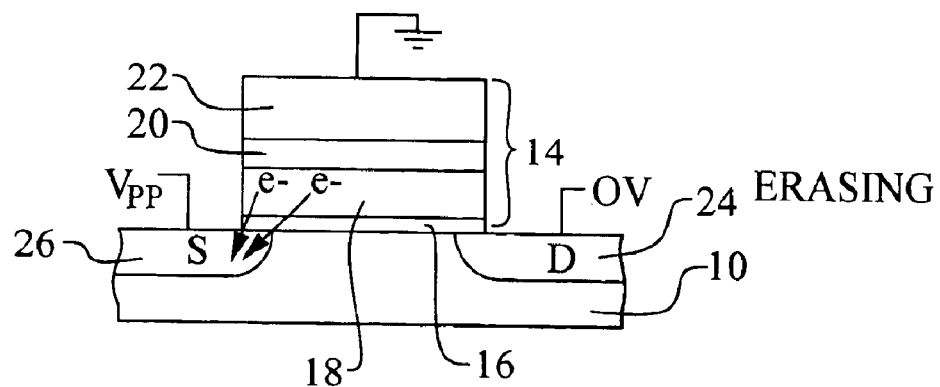
FIG. 1 illustrates a prior art, flash EEPROM memory device with a stacked gate. Methods of erasing, programming, and reading are shown.
Figure 1:
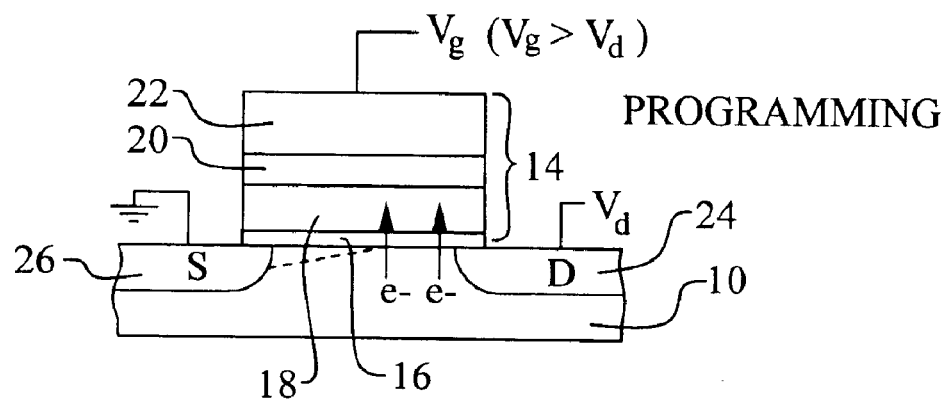
Figure 1:
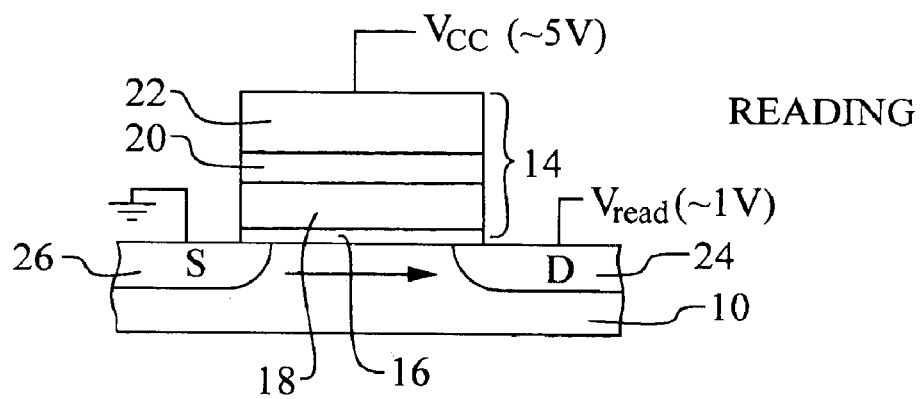
Figure 2:
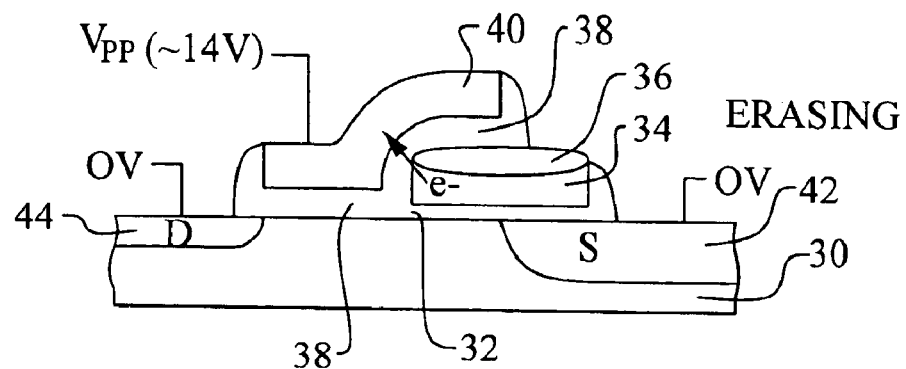
FIG. 2 illustrates a prior art, flash EEPROM memory device with a split gate. Methods of erasing, programming, and reading are shown.
Figure 2:
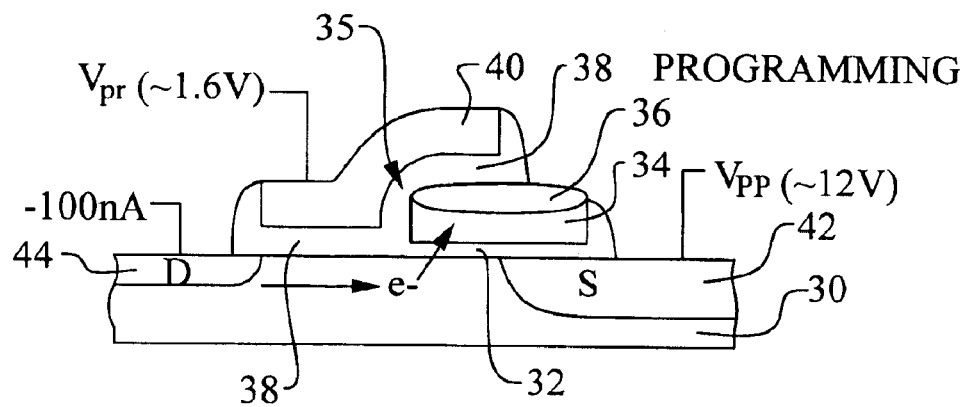
Figure 2:
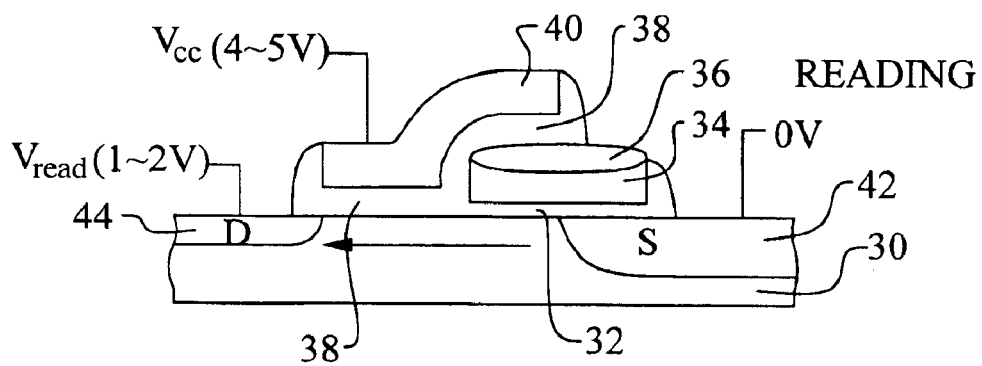
Figure 3:
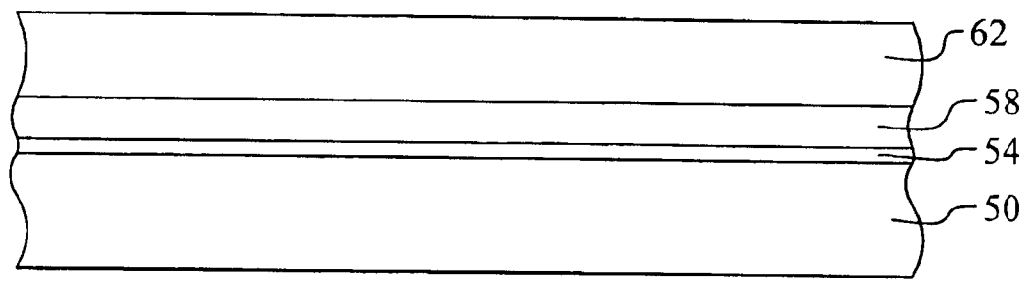
FIGS. 3 through 11 illustrate a preferred embodiment of the present invention showing a method to form a stacked gate, flash device having a novel, tipped floating gate.

Referring now to FIGS. 3 through 11, a preferred embodiment of the present invention is illustrated. Several important features of the present invention are shown and discussed below. In the preferred embodiment, a flash memory device is formed. Referring now particularly to FIG. 3, a cross-section of a partially complete flash memory device-is shown. A substrate 50 is provided. The substrate 50 preferably comprises a semiconductor material and, more preferably, comprises monocrystalline silicon. Silicon, if used, can have any of the typical crystal orientations as are well known in the art. Further, the substrate may be doped or undoped with impurity ions as is also well known in the art. Preferably, the substrate 50 comprises silicon that is lightly doped to either n-type or p-type. In addition, the substrate 50 may comprise additional layers such as in the case of a silicon-on-oxide (SOI) substrate.

As an important feature, a gate dielectric layer 54 is formed overlying the substrate 50. The gate dielectric layer 54 may be formed by thermal oxidation of the substrate 50 or by a CVD process. Preferably, the gate dielectric layer 54 is formed by the thermal oxidation of the silicon substrate 50 and to a thickness of between about 10 Å and about 1,000 Å. The very thin, gate dielectric layer 54 serves as the tunneling oxide underlying the planned floating gate.

As another important feature, a first conductor layer 58 is next deposited overlying the gate dielectric layer 54. The first conductor layer 58 will be used to form the floating gate electrode in subsequent process steps. The first conductor layer 58 preferably comprises polysilicon but may comprise other conductive materials such as are known in the art. More preferably, the first conductor layer 58 comprises polysilicon that is deposited by a CVD or a low pressure CVD process and to a thickness of between about 1,000 Å and about 5,000 Å. If polysilicon is used for the first conductor layer 58, this polysilicon may be doped or undoped and, if doped, the doping may be performed insitu with the deposition or by a later ion implantation.

As another important feature, a masking layer 62 is deposited overlying the first conductor layer 58. The masking layer 62 is used to define the position of the subsequently formed floating gate tips. The masking layer 62 comprises a material differing from the first conductor layer 58 such that each layer may be etched or removed independently. Preferably, the masking layer 62 comprises silicon nitride. The masking layer 62, if silicon nitride, is preferably deposited by CVD or low pressure CVD to a thickness of between about 100 Å and about 1,000 Å.

Figure 4:
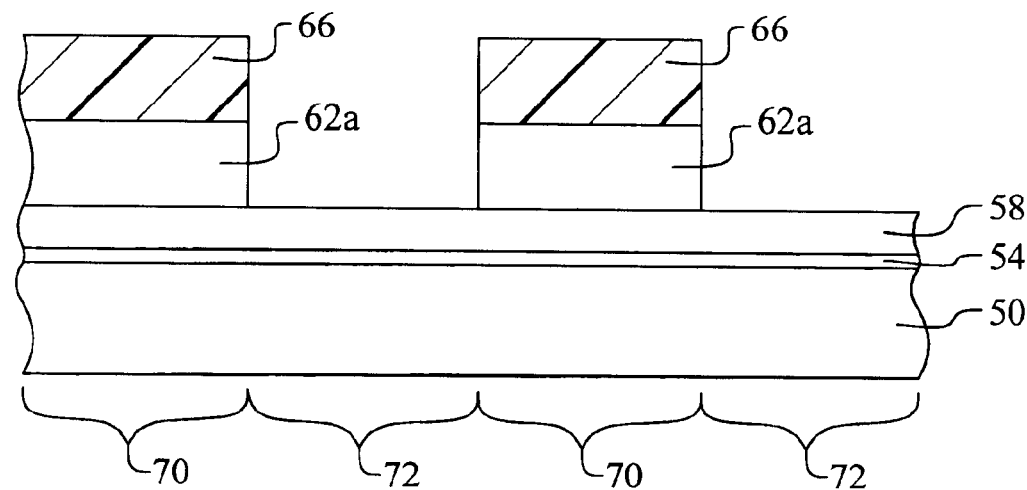

Referring now to FIG. 4, another important feature of the preferred embodiment of the present invention is illustrated. The masking layer 62 is patterned to expose first regions 72 of the first conductor layer 58 and to cover second regions 70 of the first conductor layer 58. The patterning step preferably comprises a photolithographic definition and etch sequence. For example, a photoresist layer 66 is deposited overlying the masking layer 62. The photoresist layer 66 is exposed to actinic light through a pattern-bearing mask, not shown. The photoresist layer 66 is then developed to remove parts of the photoresist 66 that are either cross-linked or not cross-linked, depending on the photoresist type, by the exposure step. A patterned photoresist layer 66 is thereby created that is a transferred image, either positive or negative, of the mask. An etch step is then performed to remove the masking layer 62 where it is exposed by the photoresist layer 66 while leaving parts of the masking layer 62a underlying the photoresist 66. This etch step may comprise a dry etch or a wet etch as is known in the art. The photoresist layer 66 is then stripped away.

Figure 5:
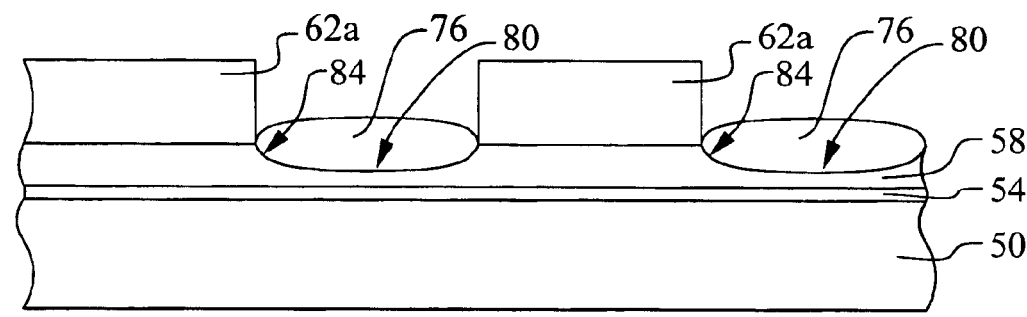

Referring now to FIG. 5, another important feature of the present invention is illustrated. A plurality of first concave surfaces 80 and 84 are formed on the first conductor layer 58 first regions. The first concave surfaces 80 and 84 are preferably formed by thermally oxidizing the first conductor layer 58. More preferably, the first conductor layer 58 comprises polysilicon and a first oxide layer 76 is thermally grown on the polysilicon 58. The first oxide layer 76 is grown to a substantial thickness of between about 100 Å and about 6,000 Å.

During the thermal oxidation process, a substantial part of the first conductor layer 58 is consumed and converted into silicon oxide 76. This oxidation reaction occurs to the greatest extent in the area 80 of the first conductor layer 58 farthest from the masking layer 62a. In the area 84 of the first conductor layer 58 nearest the masking layer 62a, the reaction is limited in its effect such that a lesser amount of the polysilicon 58 is converted to oxide 76. The thermal oxidation process results in the formation of first concave surfaces 80 and 84 on the first conductor layer 58 in the first regions.

Figure 6:
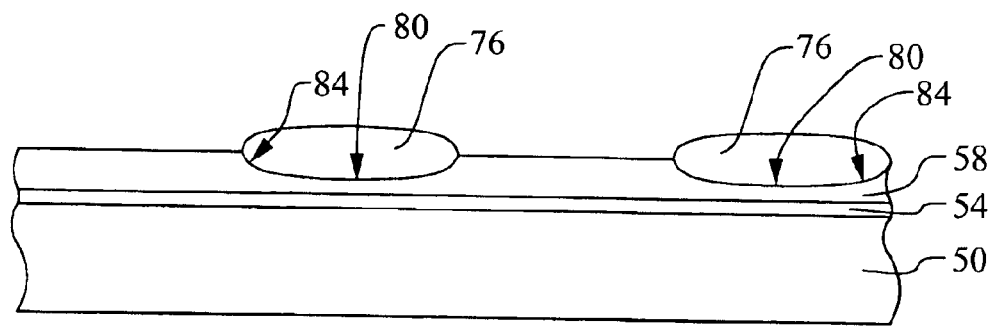

Referring now to FIG. 6, another important feature of the present invention is illustrated. The masking layer 62a is removed. The removal of the masking layer 62a reveals the underlying first conductor layer 58 that had been previously protected by the masking layer 62a. The masking layer 62a may be removed by a wet or a dry etching process. Preferably, the masking layer 62a comprises silicon nitride and is removed using a wet etch comprising phosphoric acid.

Figure 7:
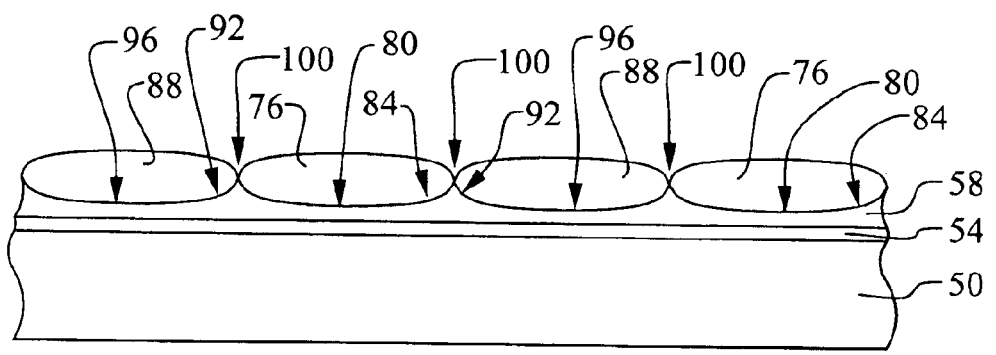

Referring now to FIG. 7, another important feature of the present invention is illustrated. A plurality of second concave surfaces 92 and 96 are formed on the first conductor layer 58 in the second regions. The second concave surface 92 and 96 are preferably formed by thermally oxidizing the first conductor layer 58 in the second regions that are exposed by the removal of the masking layer 62a. More preferably, the first conductor layer 58 comprises polysilicon and a second oxide layer 88 is thermally grown on the polysilicon 58. The second oxide layer 88 is grown to a substantial thickness of between about 100 Å and about 6,000 Å.

As in the formation of the first oxide layer 76, a substantial part of the first conductor layer 58 is consumed and converted into silicon oxide 88. This oxidation reaction occurs to the greatest extent in the area 96 of the first conductor layer 58 farthest from the previously formed, first oxide layer 76. In the area 92 of the first conductor layer 58 nearest the first oxide layer 76, the reaction is limited in its effect such that a lesser amount of the polysilicon 58 is converted to oxide 88. The second thermal oxidation process results in the formation of second concave surfaces 92 and 96 in the second regions of the first conductor layer 58.

Figure 8:
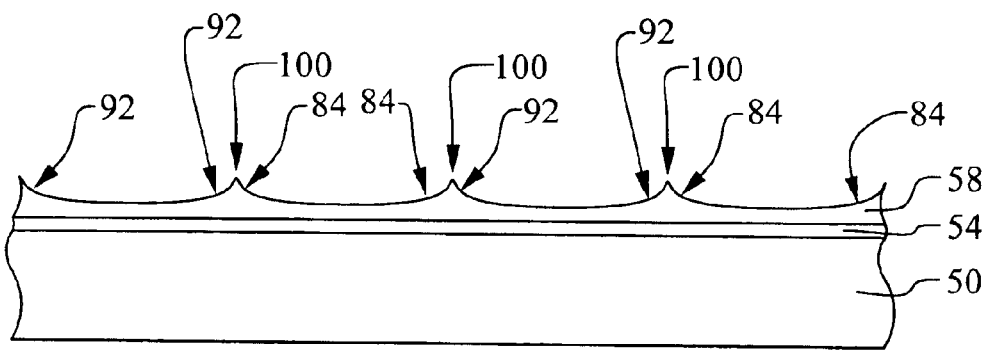

Of particular importance to the present invention, note that the first oxide layer structures 76 and the second oxide layer structures 88 abut, or interface, at relative peaks 100 of the remaining first conductor layer 58. The interfaces 100 between the first and second oxide layers 76 and 88 are important because these peaks 100 are optimally used in the novel, floating gates of the present invention. Referring now to FIG. 8, the first and second oxide layers 76 and 88 are removed to reveal the top surface topology of the first conductor layer 58. The first conductor layer peaks 100 occur at the former interfaces of the first and second oxide layer 76 and 88.

Figure 9:
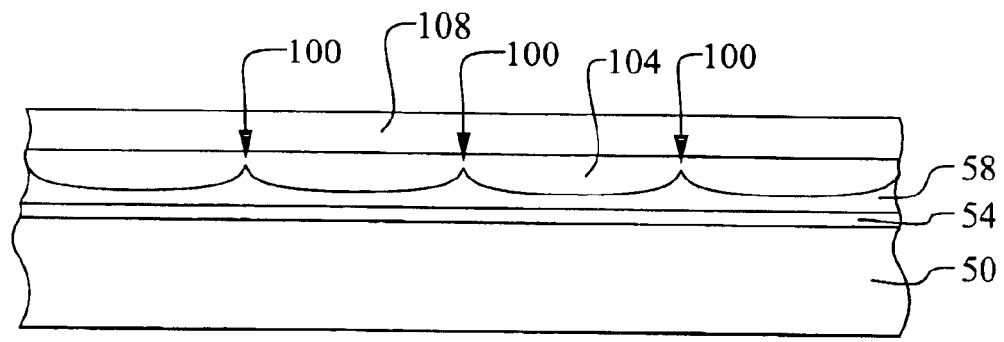

Referring now to FIG. 9, other features of the preferred embodiment of the present invention are illustrated. A second dielectric layer 104 is deposited overlying the first conductor layer 58. The second dielectric layer 104 is preferably deposited by a CVD process to a thickness of between about 100 Å and about 10,000 Å. The second dielectric layer 104 serves as the inter-gate oxide between the planned floating gate and the planned control gate.

A second conductor layer 108 is then deposited overlying the second dielectric layer 104. The second conductor layer 108 will be used to form the control gate electrode in subsequent process steps. The second conductor layer 108 preferably comprises polysilicon but may comprise other conductive materials such as are known in the art. More preferably, the second conductor layer 108 comprises polysilicon that is deposited by a CVD or a low pressure CVD process and to a thickness of between about 1,000 Å and about 5,000 Å. If polysilicon is used for the second conductor layer 108, this polysilicon may be doped or undoped and, if doped, the doping may be performed insitu with the deposition or by a later ion implantation.

Figure 10:
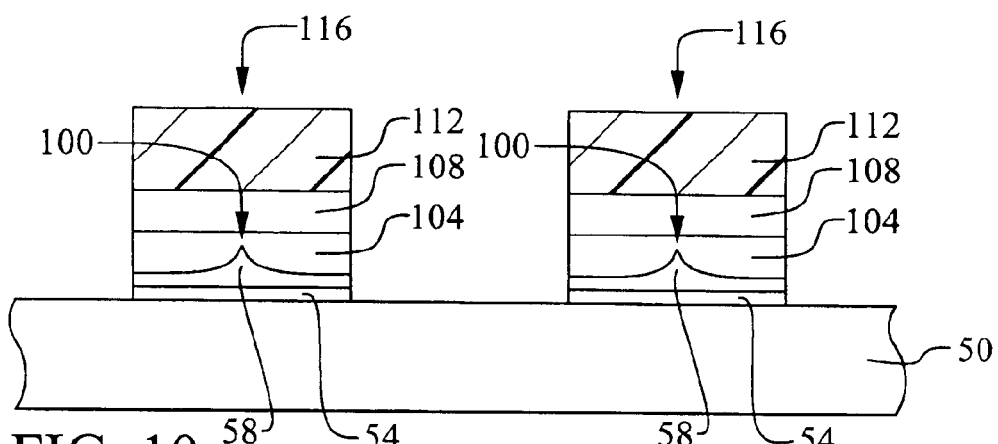

Referring now to FIG. 10, another important feature of the present invention is illustrated. The second conductor layer 108, the second dielectric layer 104, and the first conductor layer 58 are patterned to form stacked gates 116. The stacked gates 116 comprise control gates 108 and floating gates 58. The floating gates 58 comprise the first conductor layer 58 overlying the substrate 50 with the gate dielectric layer 54 therebetween. The control gates 108 comprise the second conductor layer 108 overlying the floating gates 58 with the second dielectric layer 104 therebetween.

The stacked gates 116 are preferably patterned using a photolithographic definition and etch sequence. For example, a photoresist layer 112 is deposited overlying the second conductor layer 108. The photoresist layer 112 is exposed to actinic light through a pattern-bearing mask, not shown. The photoresist layer 112 is then developed to remove parts of the photoresist 112 that are either cross-linked or not cross-linked, depending on the photoresist type, due to the exposure process. A patterned photoresist layer 112 is thereby created that is a transferred image, either positive or negative, of the mask. An etch step, or series of etching steps, is then performed to remove the second conductor layer 108, the second dielectric layer 104, and the first conductor layer 58 where exposed by the photoresist layer 112.

This etch step may comprise a dry etch or a wet etch as is known in the art. Preferably, a high precision, dry etching process is used. The photoresist layer 112 is then stripped away. Of special importance to the present invention is the fact that the stacked gates are patterned such that the first conductor layer 58 peaks 100 are included in the interior of the floating gates 58.

Figure 11:
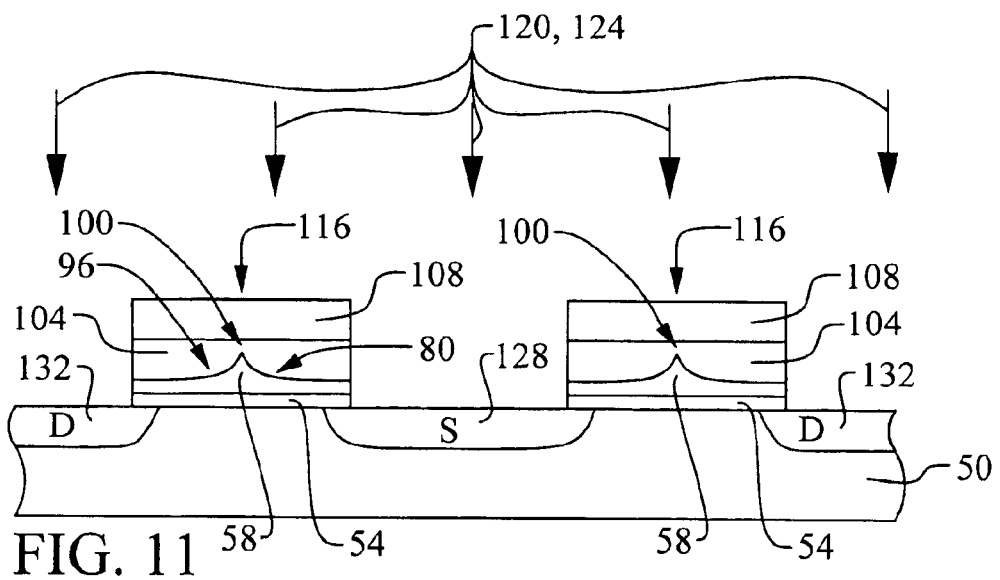

Referring now to FIG. 11, another important feature of the present invention is illustrated. Ions are implanted 120 and 124 into the substrate 50 to form drain regions 132 and source regions 128 and to complete the flash devices. The source and drain regions 128 and 132 may be formed using a single ion implantation. Alternatively, two ion implantation steps may be performed to form drain regions 132 and source regions 128 of differing depths or concentrations. The drain and source regions 132 and 128 are self-aligned to the stacked gates 116.

The resulting flash devices may now be described. The device comprises, first, a substrate 50. A floating gate 5B overlies the substrate 50. The floating gate 58 comprises a gate dielectric layer 54 overlying the substrate 50 and a first conductor layer 58 overlying the gate dielectric layer 54. The first conductor layer 58 comprises first and second concave surfaces 80 and 96. The interfaces between the first and second concave surfaces 80 and 96 form vertical tips 100 on the floating gate 58. A control gate 108 overlies the floating gate 58. The control gate 108 comprises a second dielectric layer 104 overlying the floating gate 58 and a second conductor layer 108 overlying the second dielectric layer 104.

Figure 12:
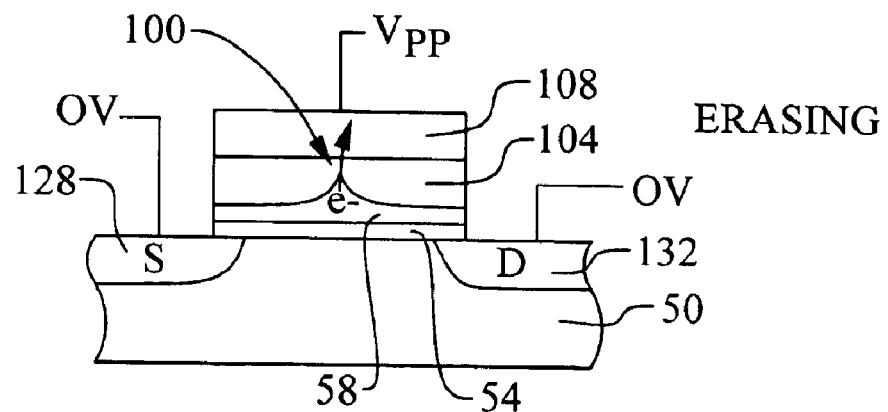
FIG. 12 illustrates the preferred embodiment of the present invention. Methods of erasing, programming, and reading are shown.
Figure 12:
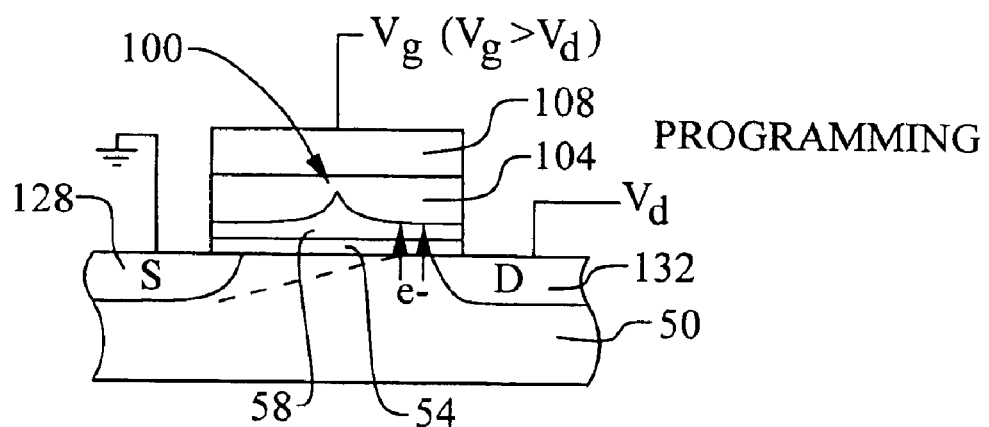
Figure 12:
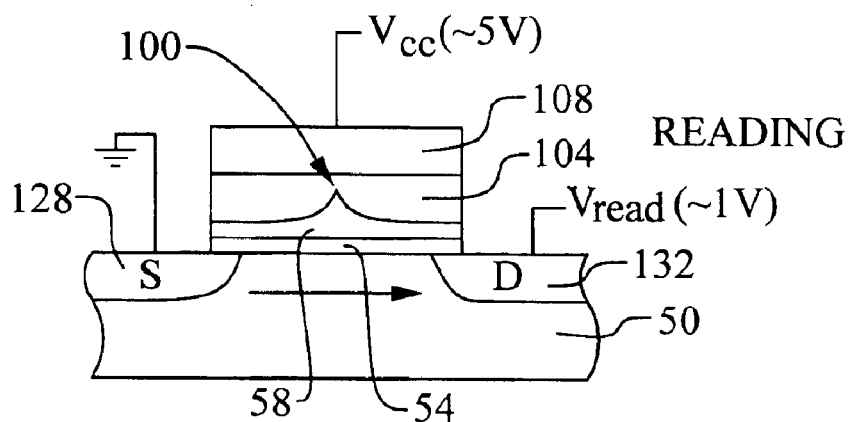

Referring now to FIG. 12, the performance of the novel, stacked gate device of the present invention is illustrated. The device is preferably erased by forcing a programming voltage $V_{pp}$ on the control gate 108 of the device while the drain 132 and source 128 are grounded. Electrons are easily pulled from the floating gate 58 to the control gate 108 under the gate bias through the novel, vertical peak-100 of the floating gate 58. The structure of the device allows the floating gate 58 to be completely and reliably erased using a relatively low programming voltage $V_{pp}$ of between about 2.5 Volts and about 20 Volts.

The device is preferably programmed by forcing a drain-to-source voltage $V_d$ of between about 0.1 Volts and about 10 Volts while the control gate is forced to a higher voltage $V_g$ of between about 2.5 Volts and about 20 Volts. As a result, the device is turned ON and electrons are injected into the floating gate 58 due to impact ionization. The device is read by forcing about 5 Volts, or $V_{cc}$, on the control gate while a small reading voltage of about 1 Volt is forced from drain-to-source. The drain current is then monitored to determine the threshold voltage of the device.

Figure 13:
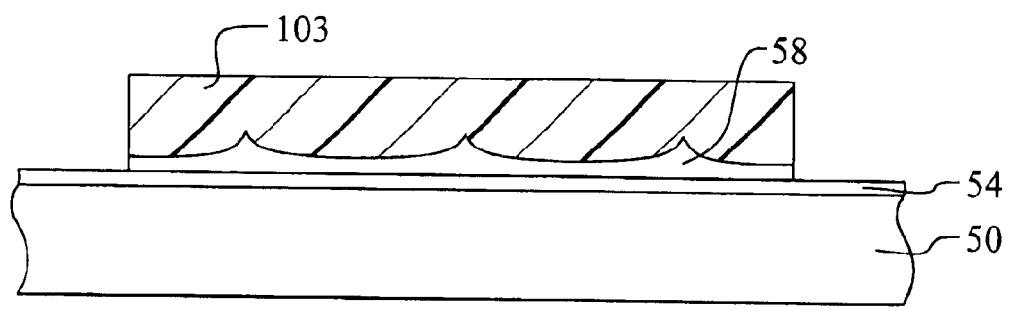
FIGS. 13 and 14 illustrate a second preferred embodiment of the present invention to form an electron emitter device.
Figure 14:
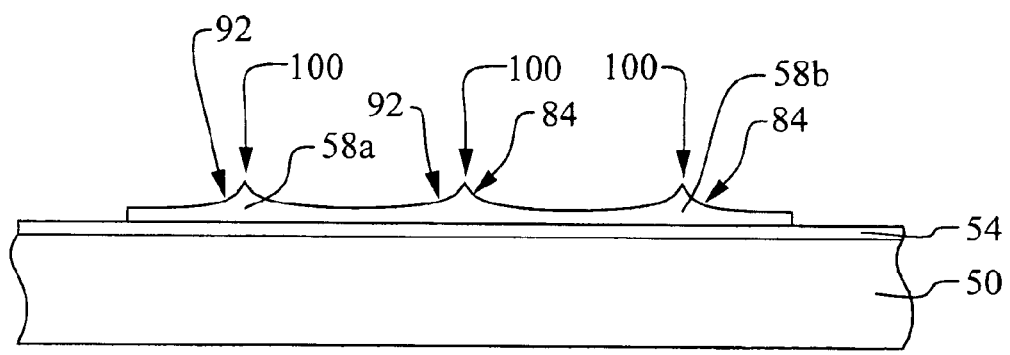

Referring now to FIGS. 13 and 14, a second preferred embodiment of the present invention is illustrated. The present invention may be used to form an electron emitter device. Referring again to FIG. 8, the continuous concave features 84 and 92 are formed on the surface of the conductive layer 58 and result in a series of vertical tips 100. Referring now to FIG. 13, the conductive layer 58 is then patterned. For example, a photoresist masking layer 103 is formed overlying the conductive layer 58. The conductor layer 58 is then patterned, by etching, to form a plurality of vertical tips between the plurality of continuous concave surfaces on the electron emitter as shown in FIG. 14. The surface of the electron emitter 58 is ideally suited to emitting electrons under a large voltage bias condition.

The advantages of the present invention may now be summarized. An effective and very manufacturable floating gate for a flash memory device is achieved. A method to form a floating gate having vertical tips to improve erasing performance is achieved. The resulting floating gate does not compromise programming, erasing, or data retention. Further, a method to form a flash memory device is achieved and applied to a stacked gate flash memory device. A floating gate with a preferred topology is achieved and applied to a stacked gate flash EEPROM device. The resulting stacked gate, flash memory device provides erasing performance comparable to that of the prior art, split-gate device while requiring less area per cell than the split-gate device.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a floating gate for a memory device, said method comprising:

forming a first conductor layer overlying a substrate with a gate dielectric layer therebetween;

forming a masking layer overlying said first conductor layer;

patterning said masking layer to expose first regions of and to cover second regions of said first conductor layer;

forming a plurality of first concave surfaces on said first regions of said first conductor layer;

removing said masking layer;

forming a plurality of second concave surfaces on said second regions of said first conductor layer; and patterning said first conductor layer to form floating gates wherein the interfaces between said plurality of first and second concave surfaces form vertical tips on said floating gates.

2. The method according to claim 1 wherein said step of forming a plurality of first concave surfaces on said first conductor layer first regions comprises converting part of said first conductor layer into a first oxide layer.

3. The method according to claim 2 wherein said first oxide layer is removed prior to said step of depositing a second dielectric layer overlying said first conductor layer.

4. The method according to claim 2 wherein said converting comprises thermal oxidation of said first conductor layer.

5. The method according to claim 1 wherein said step of forming a plurality of second concave surfaces on said first conductor layer second regions comprises converting part of said first conductor layer into a second oxide layer.

6. The method according to claim 5 wherein said second oxide layer is removed prior to said step of depositing a second dielectric layer overlying said first conductor layer.

7. The method according to claim 5 wherein said converting comprises thermal oxidation of said first conductor layer.

8. The method according to claim 1 wherein said first conductor layer comprises polysilicon.

9. The method according to claim 1 and further comprising the steps of:

depositing a second dielectric layer overlying said first conductor layer prior to said step of patterning said first conductor layer;

depositing a second conductor layer overlying said second dielectric layer; and patterning said second conductor layer and said second dielectric layer to form control gates wherein said control gates overlie said floating gates.

10. The method according to claim 9 and further comprising the step of implanting ions into said substrate to form source and drain regions for said flash memory devices.

11. A method to form a floating gate for a flash memory device, said method comprising:

forming a first conductor layer overlying a substrate with a gate dielectric layer therebetween;

depositing a masking layer overlying said first conductor layer;

patterning said masking layer to expose first regions of and to cover second regions of said first conductor layer; forming a plurality of first concave surfaces on said first conductor layer first regions by converting part of said first conductor layer into a first oxide layer;

removing said masking layer;

forming a plurality of second concave surfaces on said first conductor layer second regions by converting part of said first conductor layer into a second oxide layer;

removing said first and second oxide layers; and patterning said first conductor layer to form floating gates wherein the interfaces between said plurality of first and second concave surfaces form vertical tips on said floating gates.

12. The method according to claim 11 wherein said steps of converting said first conductor layer into first and second oxide layers comprise thermal oxidation of said first conductor layer.

13. The method according to claim 11 wherein said first conductor layer comprises polysilicon.

14. The method according to claim 11 and further comprising the steps of:

depositing a second dielectric layer overlying said first conductor layer prior to said step of patterning said first conductor layer;

depositing a second conductor layer overlying said second dielectric layer; and patterning said second conductor layer and said second dielectric layer to form control gates wherein said control gates overlie said floating gates.

15. The method according to claim 14 and further comprising the step of implanting ions into said substrate to form source and drain regions for said flash memory devices.

16. A method to form an electron emitter, comprising:

forming a conductor layer on a substrate;

forming a plurality of continuous concave surfaces on said conductor layer; and patterning said conductor layer to form a plurality of vertical tips between said plurality of continuous concave surfaces on said electron emitter.

17. The method according to claim 16 wherein said step of forming a plurality of continuous concave surfaces on said conductor layer comprises converting part of said conductor layer into an oxide layer.

18. The method according to claim 17 wherein said oxide layer is removed prior to said step of patterning said conductor layer.

19. The method according to claim 17 wherein said converting comprises thermal oxidation of said conductor layer.

20. The method according to claim 16 wherein said conductor layer comprises polysilicon.

* * * * *